United States Patent
Chang et al.

(10) Patent No.: US 7,038,267 B2
(45) Date of Patent: May 2, 2006

(54) NON-VOLATILE MEMORY CELL AND MANUFACTURING METHOD THEREOF

(75) Inventors: Ko-Hsing Chang, Hsinchu (TW); Chiu-Tsung Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/709,372

(22) Filed: Apr. 30, 2004

(65) Prior Publication Data

US 2005/0145921 A1    Jul. 7, 2005

(30) Foreign Application Priority Data

Dec. 29, 2003   (TW) ............... 92137266 A (51) Int. Cl.
*H01L 29/788*   (2006.01)
(52) U.S. Cl. ............ 257/315; 257/330; 257/390; 257/302; 257/316; 365/185.03; 438/259; 438/589
(58) Field of Classification Search .......... 257/302, 257/316, 330, 390; 438/259, 589; 365/185.03
See application file for complete search history.

(56) References Cited

U.S. PATENT DOCUMENTS

| | | | |
|---|---|---|---|
| 6,486,028 B1 * | 11/2002 | Chang et al. | 438/259 |
| 6,583,479 B1 * | 6/2003 | Fastow et al. | 257/390 |
| 6,803,284 B1 * | 10/2004 | Hwang | 438/275 |
| 2004/0130934 A1 * | 7/2004 | Prall et al. | |

* cited by examiner

*Primary Examiner*—Mai-Huong Tran
(74) *Attorney, Agent, or Firm*—Jiang Chyun IP Office (57) ABSTRACT

A non-volatile memory cell is provided. The non-volatile memory at least includes a substrate, a gate, a first source/drain region, a composite dielectric layer and a second source/drain region. A trench is formed in a substrate and a gate is formed inside the trench. The first source/drain region is formed at the bottom of the trench. The composite dielectric layer is formed between the gate and the surface of the trench. The composite dielectric layer includes at least a charge-trapping layer. The second source/drain region is formed in the substrate next to the sides of the gate.

10 Claims, 9 Drawing Sheets

NON-VOLATILE MEMORY CELL AND MANUFACTURING METHOD THEREOF

CROSS REFERENCE TO RELATED APPLICATIONS

This application claims the priority benefit of Taiwan application serial no.92137266, filed on Dec. 29, 2003.

BACKGROUND OF INVENTION

1. Field of the Invention

The present invention relates to a semiconductor memory device. More particularly, the present invention relates to a non-volatile memory cell and manufacturing method thereof.

2. Description of the Related Art

Among various types of non-volatile memory products, electrically erasable programmable read-only memory (EEPROM) is a memory device that allows multiple data writing, reading and erasing operations. In addition, the stored data will be retained even after power to the device is removed. With these advantages, it has been broadly applied in personal computer and other electronic equipment. A typical EEPROM has a polysilicon floating gate and a polysilicon control gate. To program data into the memory device, electrons are injected into the floating gate. The injected electrons will distribute evenly across the entire polysilicon floating gate. However, a defective tunneling oxide layer underneath the polysilicon floating gate defective would result in leakage current adversely affecting the reliability of the device.

To avoid leakage current in the EEPROM device, a charge-trapping layer is used instead of the conventional polysilicon floating gate. The charge-trapping layer is fabricated using silicon nitride, for example. In general, the silicon nitride charge-trapping layer is sandwiched between a pair of silicon oxide layers to form an oxide-nitride-oxide composite stack structure. The EEPROM device with the stacked gate structure is known as a silicon/oxide/nitride/oxide/silicon (SONOS) memory device.

Figure 1:
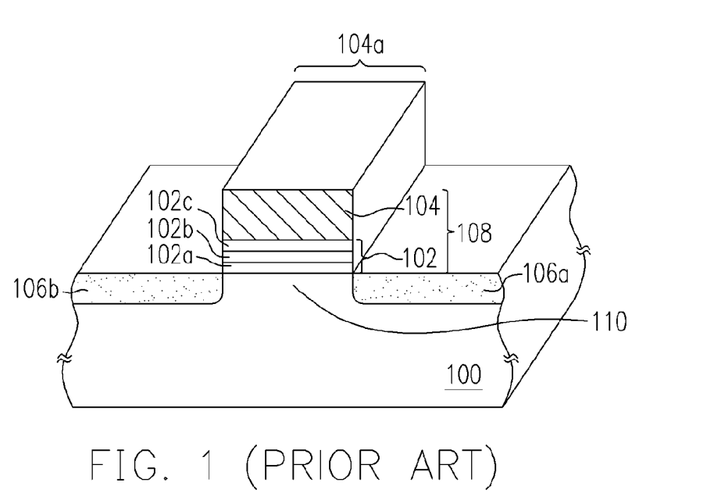
FIG. 1 is a schematic cross-sectional view of a conventional SONOS memory cell.

FIG. 1 is a schematic cross-sectional view of a conventional SONOS memory cell. As shown in FIG. 1, the SONOS memory cell includes a substrate 100, a composite dielectric layer 102 having a silicon oxide layer 102a, a silicon nitride layer 102b and a silicon oxide layer 102c, a control gate 104, a drain region 106a and a source region 106b. The silicon oxide layer 102a/silicon nitride layer 102b/silicon oxide layer 102c composite dielectric layer 102 and the control gate 104 are sequentially disposed over the substrate 100 to form a stacked gate structure 108. A channel region 110 is formed in the substrate 100 underneath the stacked gate structure 108. The drain region 106a and the source region 106b are disposed in the substrate 100 next to each side of the stacked gate structure 108.

With the miniaturization of integrated circuit devices, length of the control gate in each SONOS memory cell is reduced. However, a reduction of gate length will shorten the channel 110 underneath the silicon oxide layer 102a. Hence, when data is programmed into the memory cell, the probability of a punch through between the drain region and the source region is increased thereby affecting its electrical performance. Furthermore, width 104a of the channel 110 has significant effect on the storage efficiency of the SONOS memory cell. In general, the storage efficiency will deteriorate with a shortening of the gate width 104a. In addition, a reduction of memory cell dimensions will eventually encounter critical dimension problem in photolithographic process. Thus, any method capable of increasing the coupling rate of a miniaturized SONOS memory cells is eagerly sought.

On the other hand, with the invention of more powerful computer software, the demand for a larger memory capacity by the software program also increases considerably. The present device miniaturization trend and memory multiplication demands substantial modifications of the SONOS memory cell structure and manufacturing method thereof. In the deep sub-micron fabrication regime, how to increase memory storage capacity within a smaller space is now a common research topic.

SUMMARY OF INVENTION

Accordingly, the present invention provides a method of manufacturing a non-volatile memory cell capable of producing a miniaturized memory cell with a high coupling ratio.

The present invention provides a non-volatile memory cell having a smaller device dimension to increase the level of integration and increase the memory cell coupling ratio to increase storage capacity.

The structure of the memory cell includes at least a substrate having a trench, a gate, a first source/drain region, a composite dielectric layer and a second source/drain region. The gate is located inside the trench. The first source/drain region is set at a bottom of the trench. The composite dielectric layer is set between the gate and the surface of the trench. The composite dielectric layer includes at least a charge-trapping layer. The second source/drain region is set in the substrate next to the sides of the gate.

The composite dielectric layer further includes a bottom dielectric layer, a charge-trapping layer and a cap dielectric layer. Furthermore, the composite dielectric layer is a silicon-oxide/silicon-nitride/silicon-oxide stack layer.

Accordingly, the composite dielectric layer (dielectric layer/charge-trapping layer/dielectric layer) of the non-volatile memory cell and the gate are set within the trench. Furthermore, the source/drain regions are set in the substrate at the bottom section and the top section of the trench. Therefore, the channel regions of the memory cell are set in the substrate along the trench sidewalls (i.e. the channel regions are vertically laid). Through careful control of the etching condition, the depth of the trench can be adjusted to obtain desired channel length. Accordingly, the channel length is not dependent on gate width, and therefore the length of the channel can be tailored according to the requirements regardless of the gate width to increase the integration of the device.

The present invention also provides a method of manufacturing a non-volatile memory cell. First, a substrate is provided. A trench is formed in the substrate and then a first source/drain region is formed at the bottom of the trench. Thereafter, a composite dielectric layer is formed over the surface of the trench. The composite dielectric layer includes at least a charge-trapping layer. A gate is formed over the composite dielectric layer. Finally, a second source/drain region is formed in the substrate on each side of the gate.

In the present invention, the composite dielectric layer and the gate are formed within the trench in the substrate. Furthermore, the source/drain regions are set in the substrate at the bottom of the trench and in the substrate laterally adjacent to the trench. Thus, the channel region of the memory cell is set along the sidewalls of the trench (that is, vertical channel regions). Through careful control etching process conditions, the depth of the trench can be adjusted to obtain a desired channel length. Accordingly, the channel length is not dependent on gate width, and therefore the length of the channel can be tailored according to the requirements regardless of the gate width to increase the integration of the device.

Furthermore, forming the composite dielectric layer (dielectric layer/charge-trapping layer/dielectric layer) and the gate inside the trench is equivalent to connecting a pair of devices in parallel. Hence, the effective channel length and memory cell current is increased compared with a conventional device having the same device dimension and line width design. In other words, it is easier to distinguish between different logic states in the memory cells. In addition, the non-volatile memory cell can be fabricated using a simple semiconductor process so that the fabrication process may be easily integrated with other conventional complementary metal-oxide-semiconductor (CMOS) processes.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The following drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 2A:
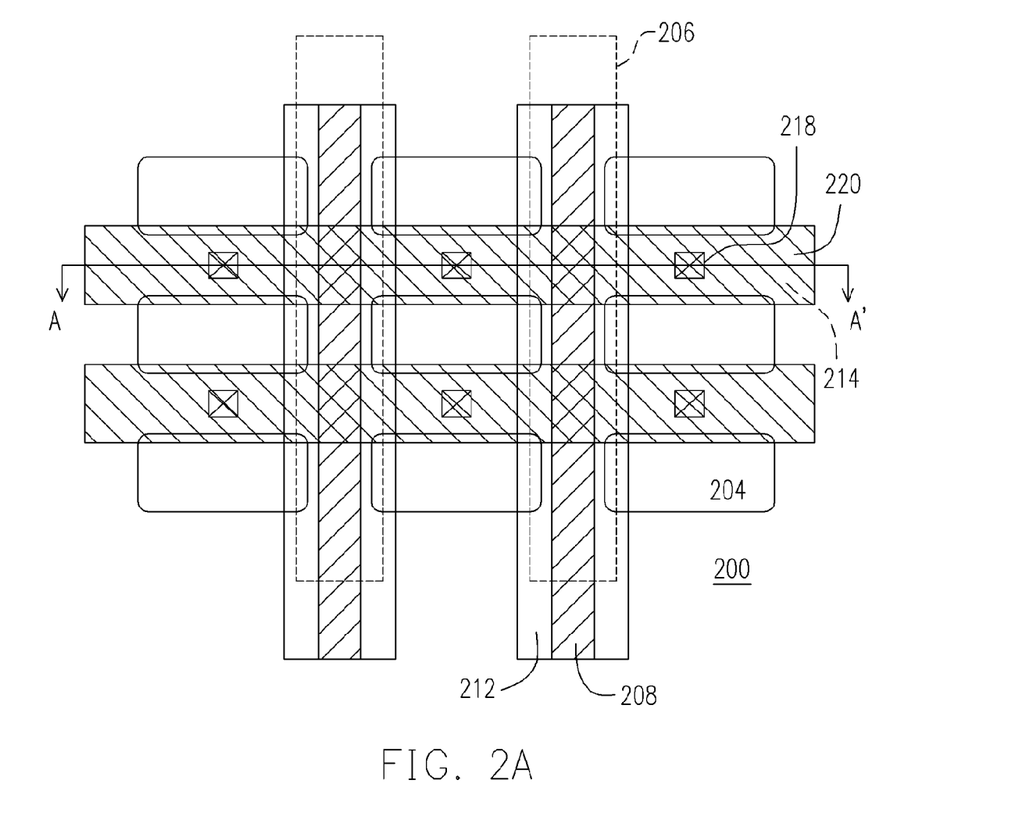
FIG. 2A is a top view showing the structure of a non-volatile memory cell according to one embodiment of the present invention.
Figure 2B:
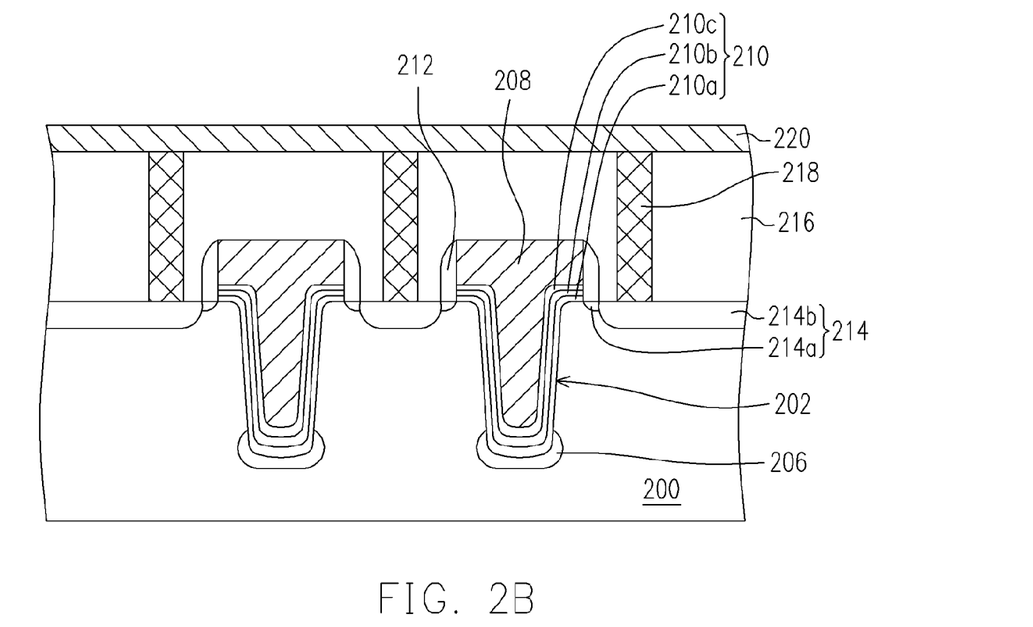
FIGS. 2B and 2C are schematic cross-sectional views of a non-volatile memory cell according to one embodiment of the present invention.

FIG. 2A is a top view showing the structure of a non-volatile memory cell according to one embodiment of the present invention. FIG. 2B is a schematic cross-sectional view of the non-volatile memory cell taken along line A–A" of FIG. 2A. As shown in FIGS. 2A and 2B, the structure of the non-volatile memory cell includes a substrate 200, a device isolation structure 204, a source/drain region 206, a gate 208, a composite dielectric layer 210, a spacer 212, a source/drain region 214, an inter-layer dielectric layer 216, a contact plug 218 and a conductive line 220.

The substrate 200 is a silicon substrate, for example. The trench 202 is formed within the substrate 200. The device isolation structure 204 is set within the substrate 200 for defining an active region in the substrate 200. The device isolation structure 204 is a field oxide layer structure or shallow trench isolation (STI) structure, for example.

The source/drain region 206 is formed at the bottom of the trench 202. The gate 208 fills the trench 202 with a top portion protruding above the surface of the substrate 200. The gate 208 is fabricated using a doped polysilicon layer, for example.

The composite dielectric layer 210 is formed between the gate 208 and the surface of the trench 202, and between the gate 208 and the substrate 200. The composite dielectric layer 210 includes at least a bottom dielectric layer 210a, a charge-trapping layer 210b and a cap dielectric layer 210c. The bottom dielectric layer 210a is fabricated using a silicon oxide material, for example. The bottom dielectric layer 210a mainly serves as a tunneling dielectric layer. Similarly, the cap dielectric layer 210c is fabricated using silicon oxide material, for example. The cap dielectric layer 210c serves as an insulation layer between the charge-trapping layer 210b and the gate 208. Obviously, the bottom dielectric layer 210a and the cap dielectric layer 210c may also be fabricated using some other dielectric materials. The charge-trapping layer 210b is fabricated using silicon nitride material, for example. However, the charge-trapping layer 210b can be fabricated using other material capable of trapping electric charges, such as, tantalum oxide, strontium titanate and hafnium oxide.

The spacers 212 are set on the sidewalls of the gate 208. The spacers 212 are fabricated using an insulating material. The source/drain region 214 is formed in the substrate 200 laterally adjacent to the gate 208. The source/drain region 214 includes a lightly doped region 214a and a heavily doped region 214b. The lightly doped region 214a is formed in the substrate 200 underneath the spacer 212.

The inter-layer dielectric layer 216 is formed over the substrate 200. The conductive line 220 is set over the inter-layer dielectric layer 216. The conductive line 220 is electrically connected to the source/drain region 214 through a contact plug 218. Here, the conductive line 220 serves as a bit line and the gate 208 serves as a word line, for example.

Accordingly, the composite dielectric layer (dielectric layer/charge-trapping layer/dielectric layer) of the non-volatile memory cell and the gate are set within the trench 202. Furthermore, the source/drain regions 206, 214 are respectively set in the substrate 200 at the bottom section of the trench 202 and in the substrate 200 laterally adjacent to the trench 202. Therefore, the channel region of the memory cell is set along the sidewalls of the trench (that is, vertical channel regions). Through careful control of etching process conditions, the depth of the trench can be adjusted to obtain a desired channel length of the channel. Accordingly, the channel length is not dependent on gate width, and therefore the length of the channel can be tailored according to the requirements regardless of the gate width to increase the integration of the device. Thus, the aforementioned problems leading to a punch through effect can be effectively avoided.

Furthermore, the gate of the non-volatile memory cell may have a structure different from the one shown in FIG.

Figure 2C:
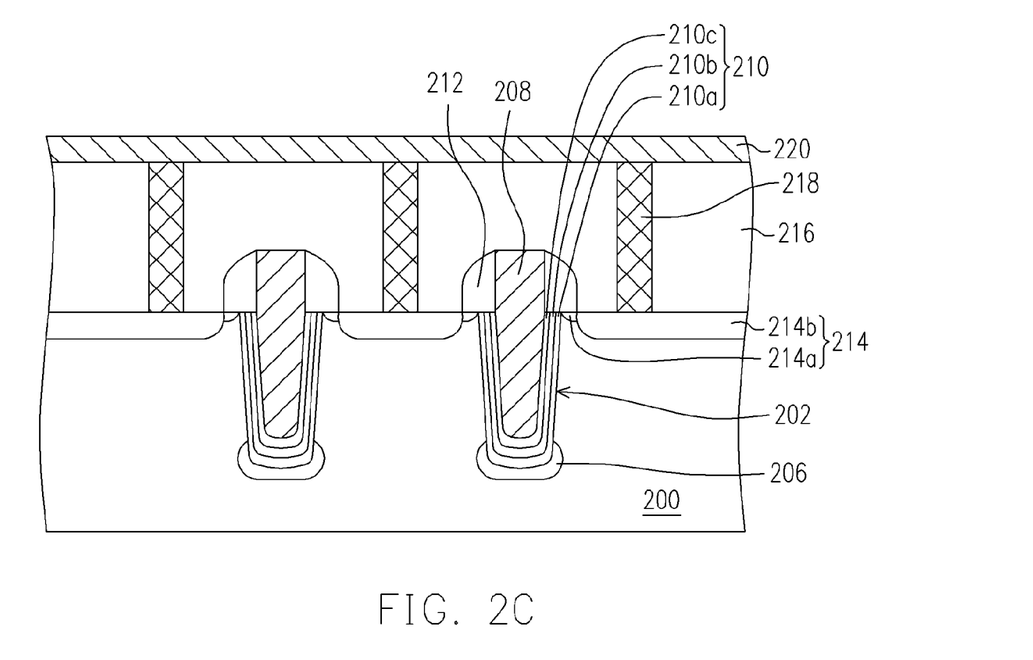

2B. For example, the gate 208 may fill up the trench 202 and protrude beyond the surface of the substrate 200 (as shown in FIG. 2C) without spreading sideways beyond the trench opening. Obviously, it is equally feasible to produce a gate that fills the trench without protruding above the surface of the substrate 200.

Figure 3:
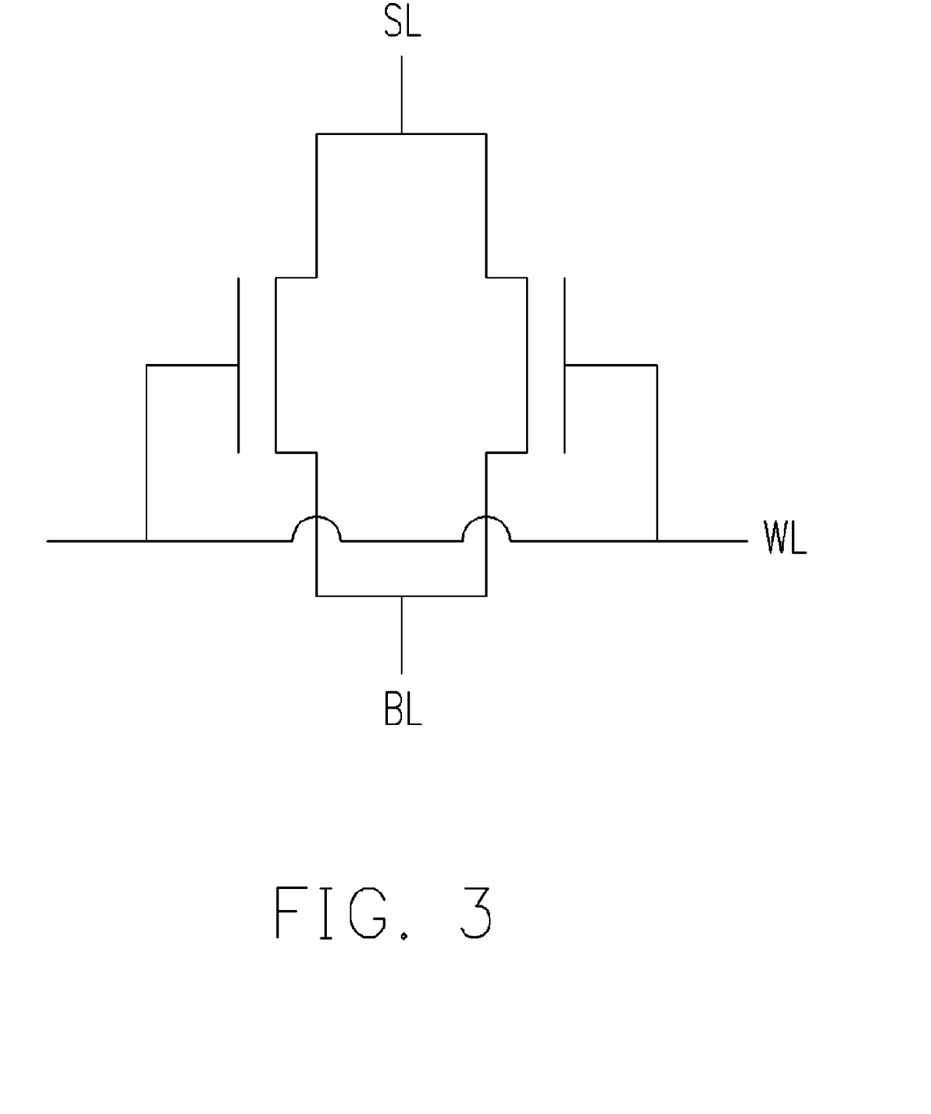
FIG. 3 is an equivalent circuit diagram of a non-volatile memory cell according to one embodiment of the present invention.

FIG. 3 is an equivalent circuit diagram of a non-volatile memory cell according to one embodiment of the present invention. As shown in FIG. 3, the memory cell can be regarded as two semiconductor devices connected in parallel. The gates, the drains and the sources of the devices in each memory cell are connected through a common gate line (word line WL), a common drain line (bit line BL) and a common source line (SL) respectively. With this configuration, the density of current flowing through the memory cell is increased and the efficiency of programming/erasing operation is improved.

Figure 4A:
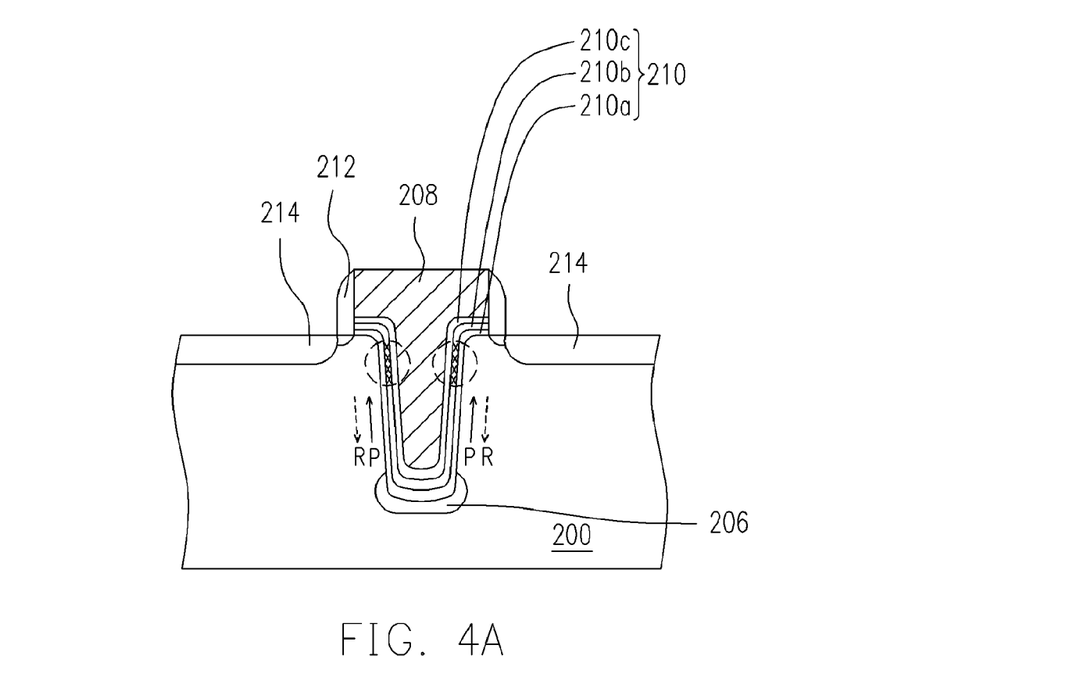
FIGS. 4A and 4B are diagrams showing the process of programming/reading data into/out of a non-volatile memory cell fabricated according to one embodiment of the present invention.
Figure 4B:
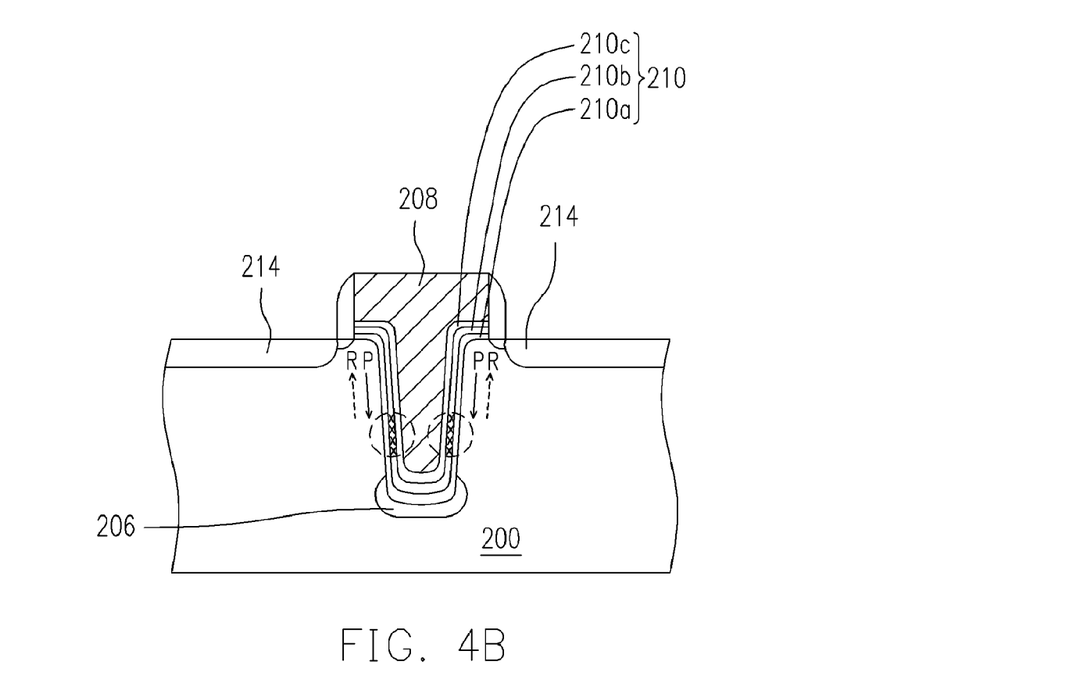

FIGS. 4A and 4B are diagrams showing the process of programming/reading data into/out of a non-volatile memory cell fabricated according to one embodiment of the present invention. In FIGS. 4A and 4B, elements identical to the ones in FIG. 2B are labeled identically. To program the memory cell in FIG. 4A, a biased voltage Vgp is applied to the gate 208 and another biased voltage Vup is applied to the source/drain region 214 while the source/drain region 206 remains in a floating state. Hence, electrons are trapped within the charge-trapping layer 210b next to the source/drain region 214. To read data from the memory cell in FIG. 4A, a biased voltage Vcc is applied to the gate 208 and another biased voltage Vur is applied to the source/drain region 214 while the source/drain region 206 remains in a floating state. Thus, data can be read from the bit line next to the source/drain region 214.

Similarly, in FIG. 4B, to program the memory cell, a biased voltage Vgp is applied to the gate 208 and a biased voltage Vdp is applied to the source/drain region 206 while the source/drain region 214 remains in a floating state. Hence, electrons are trapped within the charge-trapping layer 210b next to the source/drain region 206. To read data from the memory cell in FIG. 4B, a biased voltage Vcc is applied to the gate 208 and another biased voltage Vdr is applied to the source/drain region 206 while the source/drain region 214 remains in a floating state. Thus, data can be read from the bit line next to the source/drain region 206. In other words, the non-volatile memory of the present invention has a two-bit per cell storage capacity.

The non-memory cell of the present invention is capable of trapping electrons in the charge-trapping layer at both positions next to source/drain regions 206, 214, or one of the positions next to the source/drain regions 206, 214. Meanwhile, none of the two positions being trapped with electrons is also allowed. Hence, a memory cell with two-bit storage capacity is created. In other words, the present invention increases the data storage capacity of the memory cell without increasing the memory cell volume so that the level of integration is increased.

Figure 5A:
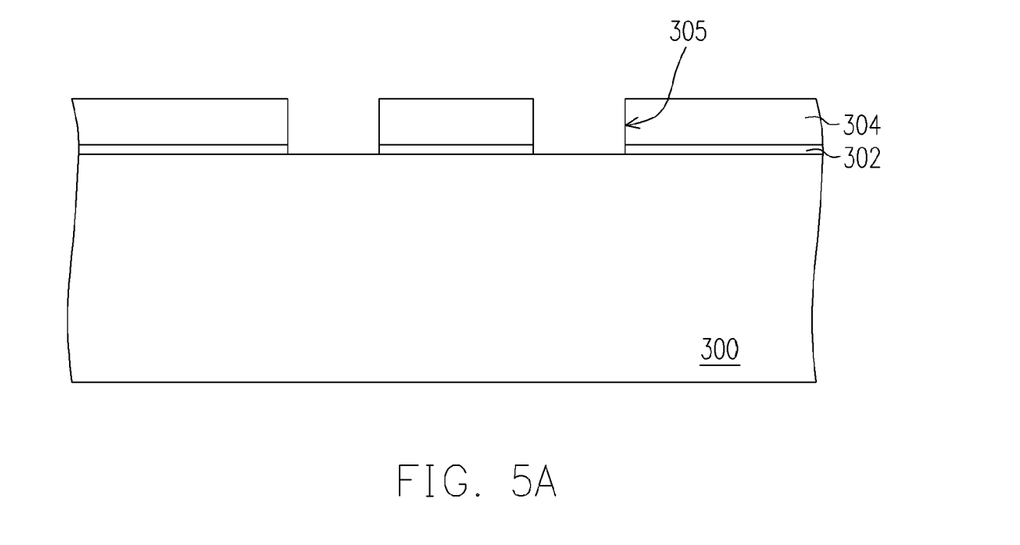
FIGS. 5A through 5F are schematic cross-sectional views showing the progression of steps for producing a non-volatile memory cell structure according to one embodiment of the present invention.

FIGS. 5A through 5F are schematic cross-sectional views showing the progression of steps of fabricating a non-volatile memory cell structure according to one embodiment of the present invention. As shown in FIG. 5A, a substrate 300 having a device isolation structure thereon, defining an active region in the substrate 300, is provided. A pad oxide layer 302 and a mask layer 304 are sequentially formed over the substrate 300. The mask layer 304 is a silicon nitride layer or other suitable material layer, for example. The mask layer 304 and the pad oxide layer 302 are etched to form openings 305.

Figure 5B:
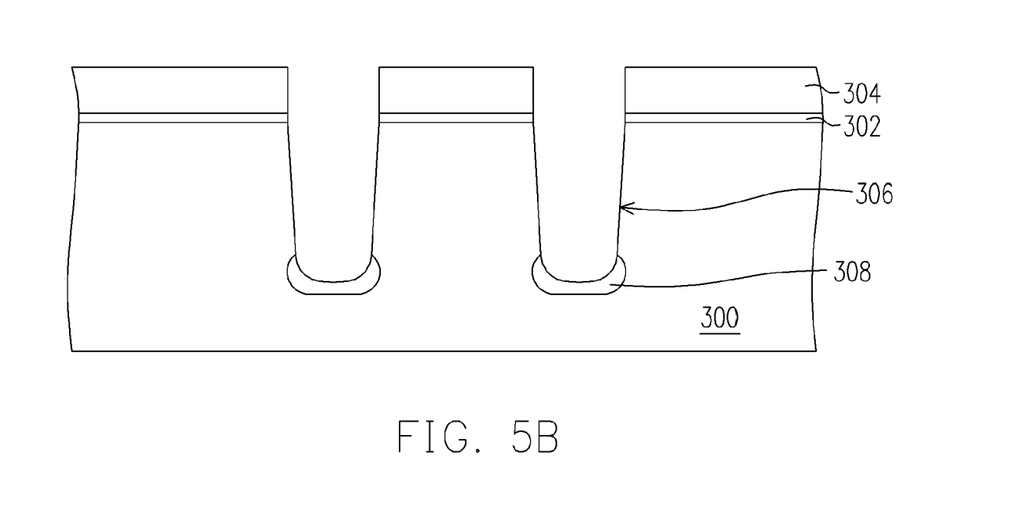

As shown in FIG. 5B, using the patterned mask layer 304 and the pad oxide layer 302 as a mask, a portion of the exposed substrate 300 is removed to form a trench 306 by performing a dry etching operation such as a reactive ion etching operation. Thereafter, a source/drain region 308 is formed at the bottom of the trench 306, for example, by performing an ion implantation process. Obviously, the source/drain region 308 can be formed by some other methods. For example, a doped insulation layer (not shown) is formed at the bottom of the trench 306 and then a cap layer (not shown) is formed on the sidewalls of the trench 306. Thereafter, the substrate 100 is subjected to a thermal treatment to drive the impurities within the doped insulation layer into the substrate 300 at the bottom of the trench 306 and form the source/drain region 308. Finally, the doped insulation layer at the bottom of the trench 306 and the cap layer on the sidewalls of the trench 306 are removed.

Figure 5C:
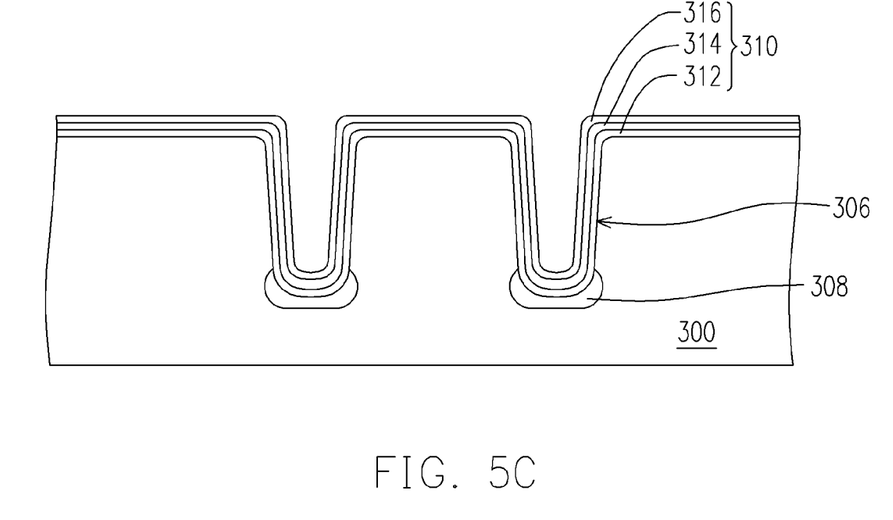

As shown in FIG. 5C, the mask layer 304 and the pad oxide layer 302 are removed and then a bottom dielectric layer 312 is formed on the surface of the substrate 300 and the trench 306. The bottom dielectric layer 312 is a silicon oxide layer formed, for example, by performing a thermal oxidation process. Thereafter, a charge-trapping layer 314 is formed over the bottom dielectric layer 312. The charge-trapping layer 314 is a silicon nitride layer formed, for example, by performing a chemical vapor deposition (CVD) process. Furthermore, the charge-trapping layer 314 can be fabricated using some other materials including nitrides, tantalum oxide, strontium titanate or hafnium oxide, for example. Afterwards, a cap dielectric layer 316 is formed over the charge-trapping layer 314. The cap dielectric layer 316 is a silicon oxide layer, for example. The bottom dielectric layer 312, the charge-trapping layer 314 and the cap dielectric layer 316 together form a composite dielectric layer 310.

Figure 5D:
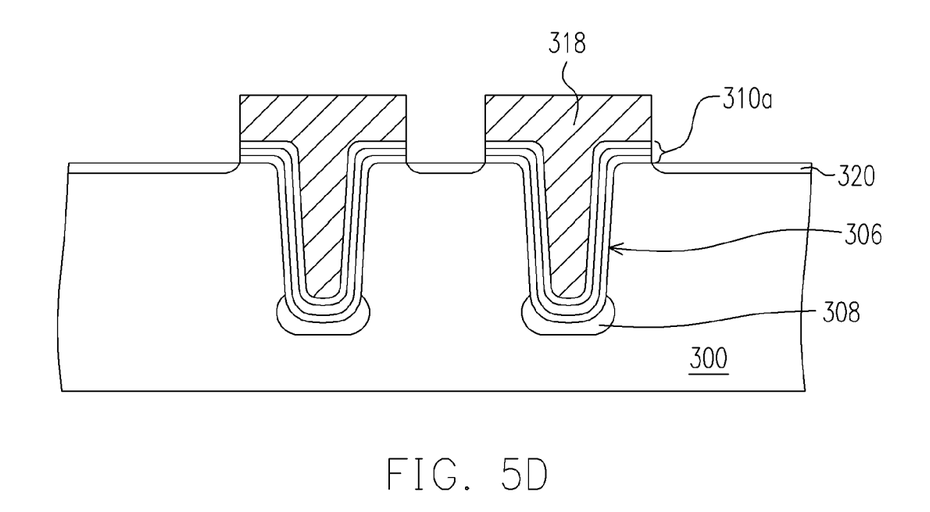

As shown in FIG. 5D, a conductive layer (not shown) is formed over the cap dielectric layer 316 to fill the trench 306 completely. The conductive layer is a doped polysilicon layer or other suitable material layer. The conductive layer is patterned to form a gate 318 above the trench 306. The gate 318 can be etched such that a portion thereof protruding from the trench 306 laterally extend over the surface of the substrate 300 (as shown in FIG. 5D) or remain above the trench 306. The exposed composite dielectric layer 310 is removed to form a residual composite dielectric layer 310a underneath the gate 318. Since the composite dielectric layer 310 has a silicon oxide/silicon nitride/silicon oxide stack structure, the non-volatile memory cell is called a silicon-oxide-nitride-oxide-silicon (SONOS) memory cell. Thereafter, a light doping process is carried out to form a lightly doped region 320 in the substrate on each side of the gate 318.

Figure 5E:
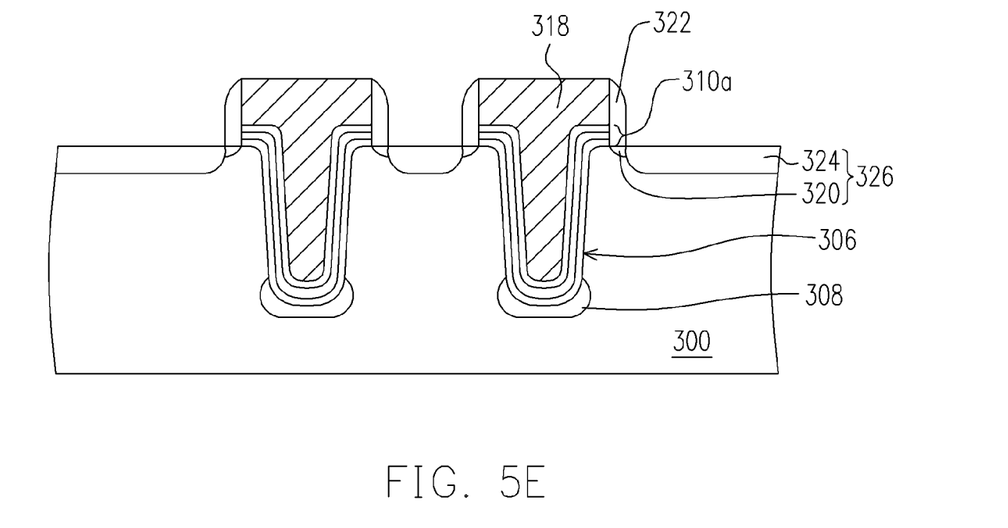

As shown in FIG. 5E, spacers 322 are formed on the sidewalls of the gate 318. The spacers 322 are fabricated using an insulating material such as silicon nitride or other suitable material. Thereafter, a heavy doping process is carried out to form a heavily doped region 324 in the substrate 300 laterally adjacent to the spacers 322. The lightly doped region and the heavily doped region 324 together form a source/drain region 326.

Figure 5F:
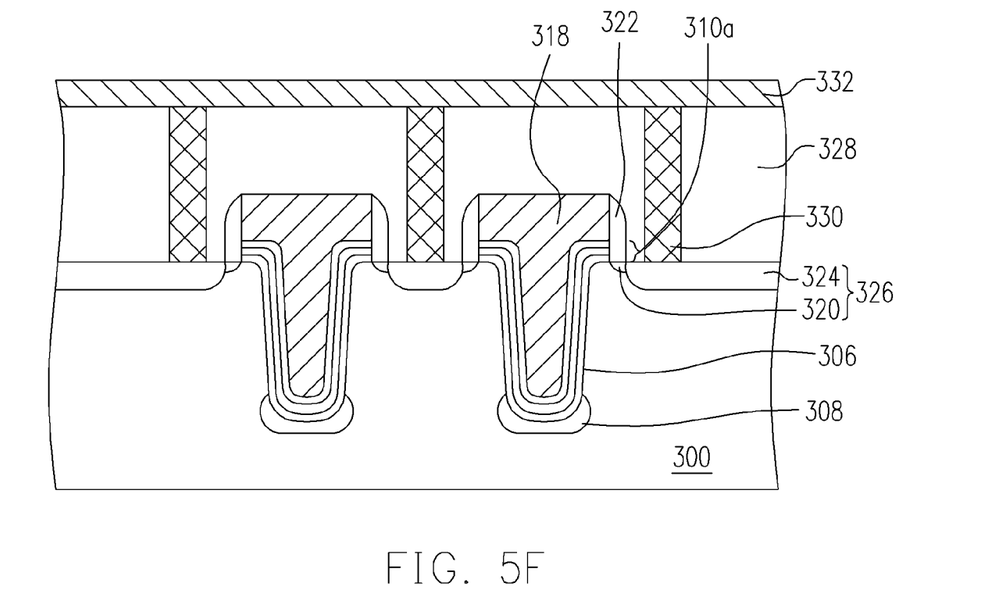

As shown in FIG. 5F, an inter-layer dielectric layer 328 is formed over the substrate 300. The inter-layer dielectric layer 328 is a borophosphosilicate glass (BPSG) layer or a phosphosilicate glass (PSG) layer formed, for example, by performing a chemical vapor deposition. An additional chemical-mechanical polishing operation is also performed to planarize the upper surface of the inter-layer dielectric layer 328. Thereafter, a contact plug 330 is formed inside the inter-layer dielectric layer 328 to electrically connect with the source/drain region 326. The contact plug 330 is formed, for example, by forming an opening (not shown) that exposes the source/drain region 326 and depositing conductive material into the opening afterwards. A conductive line 332 that electrically connects with the contact plug 330 is formed over the inter-layer dielectric layer 328. Subsequently, other downstream processes are carried out to complete the fabrication of the memory cell. Since conventional processes are used to complete the fabrication of the memory cell, detailed description of those operations is omitted herein.

Figure 6A:
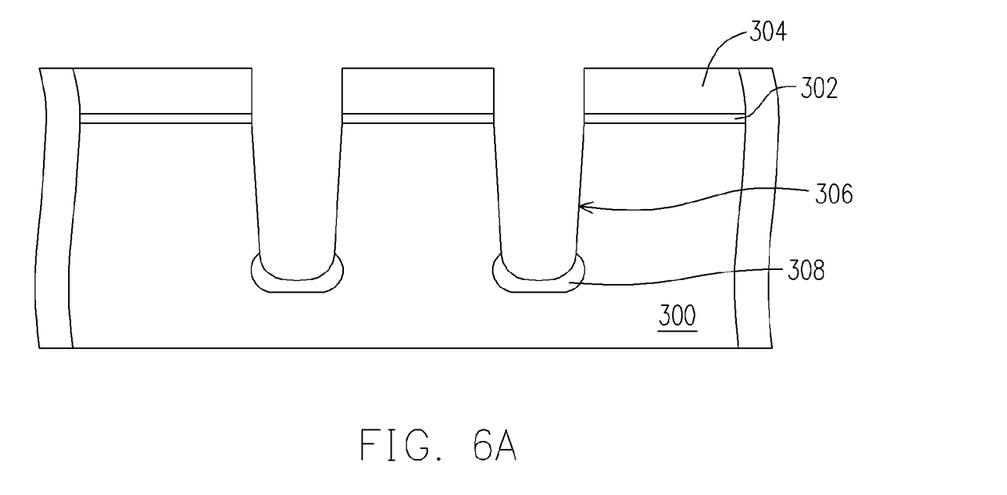
FIGS. 6A through 6D are schematic cross-sectional views showing the progression of steps for producing another non-volatile memory cell structure according to one embodiment of the present invention.

FIGS. 6A through 6D are schematic cross-sectional views showing the progression of steps fabricating a non-volatile memory cell structure according to another embodiment of the present invention. Those elements in FIGS. 6A through 6C that are identical to the ones in FIGS. 5A through 5F are labeled identically. As shown in FIG. 6A, a substrate 300 having a patterned pad oxide layer 302 and a patterned mask layer 304 formed thereon is provided. Subsequently, a trench 306 is formed in the substrate 304 and a source/drain region 308 is formed at the bottom of the trench 306.

Figure 6B:
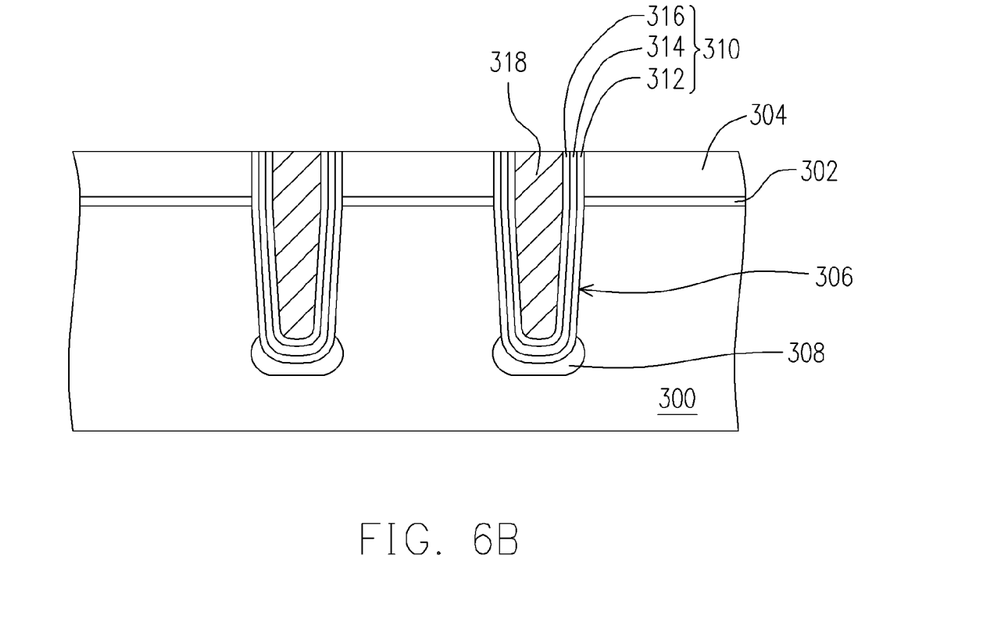

As shown in FIG. 6B, a conformal composite dielectric layer 310 is formed over the surface of the trench 306. The composite dielectric layer 310 includes a bottom dielectric layer 314, a charge-trapping layer 314 and a cap dielectric layer 316. Thereafter, a conductive layer (not shown) formed over the composite dielectric layer 310 completely filling the trench 306. The conductive layer and the composite dielectric layer 310 outside the trench 306 are removed to expose the mask layer 304 is exposed to form a gate 318 within the trench 306.

Figure 6C:
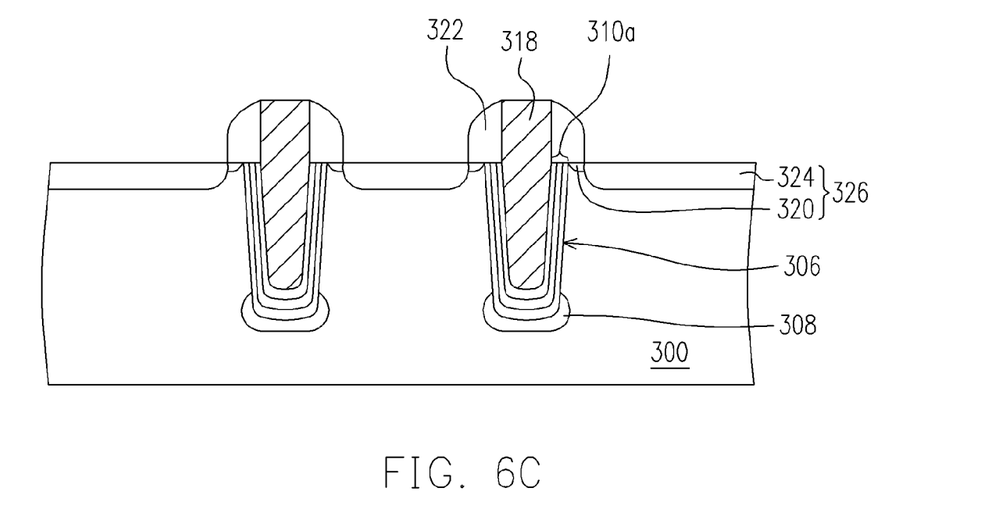

As shown in FIG. 6C, the mask layer 304, the pad oxide layer 302 and a portion of the composite dielectric layer 310 are removed. Hence, a residual composite dielectric layer 310a remains inside the trench 306. Thereafter, a lightly doped region 320 is formed in the substrate 300 laterally adjacent to the gate 318 and then spacers 322 are formed on the sidewalls of the gate 318. A heavily doped region 324 is formed in the substrate 300 on each side of the gate 318 laterally adjacent to the spacers 322. The lightly doped region 320 and the heavily doped region 324 together form a source/drain region 326.

Figure 6D:
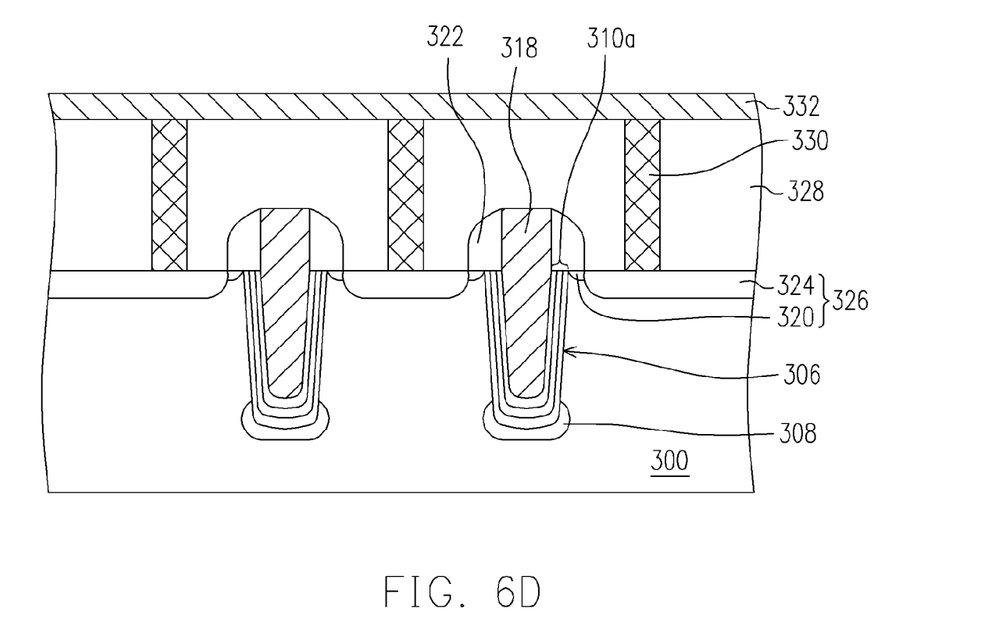

As shown in FIG. 6D, an inter-layer dielectric layer 328 is formed over the substrate 300. A contact plug 330 is formed in the inter-layer dielectric layer 328 to electrically connect with the source/drain region 326. Thereafter, a conductive line 332 is formed to electrically connect with the contact plug 330 over the inter-layer dielectric layer 328. Subsequently, other downstream processes are carried out to complete the fabrication of the memory cell. Since conventional processes are used to complete the fabrication of the memory cell, detailed description of those operations is omitted herein.

Accordingly, in the present invention, the composite dielectric layer (dielectric layer/charge-trapping layer/dielectric layer) and the gate are set within the trench. Furthermore, the source/drain regions are set in the substrate at the bottom section and the top of the trench. Therefore, the channel regions of the memory cell are set along the sidewalls of the trench (i.e. the channels are vertically laid). Through careful control of the etching process conditions, the depth of the trench can be adjusted to obtain a desirable channel length. Accordingly, the channel length is not dependent on gate width, and therefore the length of the channel can be tailored according to the requirements regardless of the gate width. Thus, the present invention allows further size reduction in the device without risk of punch through effect.

Furthermore, forming the composite dielectric layer (dielectric layer/charge-trapping layer/dielectric layer) and the gate inside the trench is equivalent to connecting a pair of devices in parallel. Hence, the coupling ratio and storage capacity of the memory cell is increased compared to a conventional device having the same device dimension and line width design. In addition, the non-volatile memory cell can be fabricated using a simple semiconductor process so that the fabrication process can be easily integrated with other conventional complementary metal-oxide-semiconductor (CMOS) processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A non-volatile memory cell, comprising:
    a substrate, having a trench thereon;
    a gate, formed within the trench;
    a first source/drain region, formed at a bottom of the trench;
    a composite dielectric layer, formed between the gate and a surface of the trench, wherein the composite dielectric layer comprises at least a charge-trapping layer;
    a second source/drain region, formed in the substrate on one side of the gate; and
    a third source/drain region located in the substrate on the other side of the gate, wherein the second source/drain region and the third source/drain region are electrically connected to a common bit line.

2. The non-volatile memory cell of claim 1, wherein the gate completely fills the trench.

3. The non-volatile memory cell of claim 1, wherein the gate fills the trench and protrudes above the substrate surface.

4. The non-volatile memory cell of claim 1, wherein the gate further laterally extend above the substrate outside the trench.

5. The non-volatile memory cell of claim 1, wherein the composite dielectric layer also laterally extend above the substrate outside the trench and positioned between the gate and the substrate.

6. The non-volatile memory cell of claim 1, wherein the composite dielectric layer further comprises:
    a bottom oxide layer, wherein the charge-trapping layer located between the gate and the bottom oxide layer; and
    a cap oxide layer, located between the gate and the charge-trapping layer.

7. The non-volatile memory cell of claim 1, further comprising spacers formed on the sidewalls of the gate.

8. The non-volatile memory cell of claim 7, further comprising a lightly doped region formed in the substrate underneath the spacers.

9. The non-volatile memory cell of claim 1, wherein material constituting the gate comprises doped polysilicon.

10. The non-volatile memory cell of claim 1, wherein the composite dielectric layer comprises a silicon oxide/silicon nitride/silicon oxide layer.

* * * * *